United States Patent [19]

Fichot

[11] 4,278,990
[45] Jul. 14, 1981

[54] LOW THERMAL RESISTANCE, LOW STRESS SEMICONDUCTOR PACKAGE

[75] Inventor: Julie Y. Fichot, Skaneateles, N.Y.

[73] Assignee: General Electric Company, Auburn, N.Y.

[21] Appl. No.: 21,488

[22] Filed: Mar. 19, 1979

[51] Int. Cl.³ .................. H01L 23/02; H01L 23/28; H01L 23/42
[52] U.S. Cl. ........................ 357/81; 357/72; 357/79; 357/80; 357/68; 228/122
[58] Field of Search ............... 357/72, 81, 82, 79, 357/80, 68; 228/122

[56] References Cited

U.S. PATENT DOCUMENTS

| 3,089,067 | 5/1963 | Biard | 357/81 |
|---|---|---|---|
| 3,699,402 | 10/1972 | McCann et al. | 357/72 |
| 3,783,347 | 1/1974 | Vladik | 357/72 |
| 3,918,084 | 11/1975 | Schierz | 357/82 |
| 3,994,430 | 11/1976 | Cusano et al. | 228/122 |
| 4,009,485 | 2/1977 | Koenig | 357/81 |
| 4,047,197 | 9/1977 | Schierz | 357/81 |
| 4,115,837 | 9/1978 | Beall et al. | 357/81 |

Primary Examiner—Andrew J. James
Attorney, Agent, or Firm—Robert J. Mooney; Stephen B. Salai

[57] ABSTRACT

A semiconductor device having especially low thermal impedance between a semiconductor element and a heatsink is described wherein the semiconductor element is directly disposed upon a thin, low thermal impedance current-spreading layer on an electrically isolated layer. An electrode connected to the current-spreading layer surrounds the semiconductor element so that it introduces no additional thermal impedance between the semiconductor element and the heatsink. Relatively inexpensive electrode materials may be used in accordance with the invention without increasing thermal impedance.

13 Claims, 6 Drawing Figures

U.S. Patent   Jul. 14, 1981   4,278,990
PRIOR ART   FIG. 1.
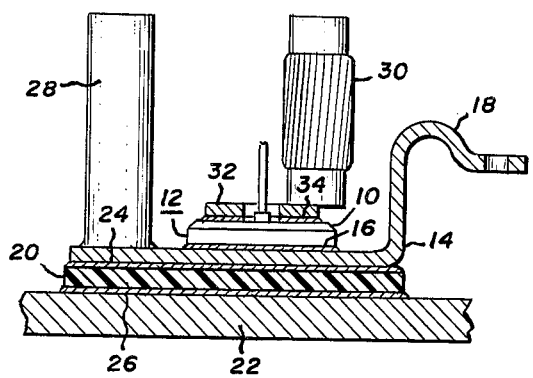
FIG. 2.
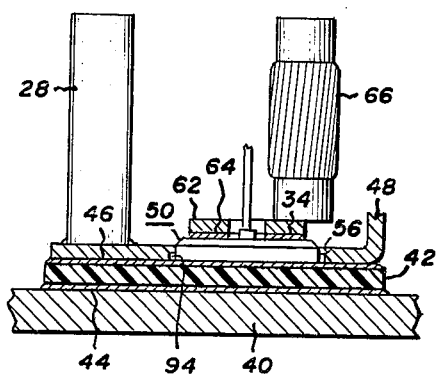
FIG. 3.
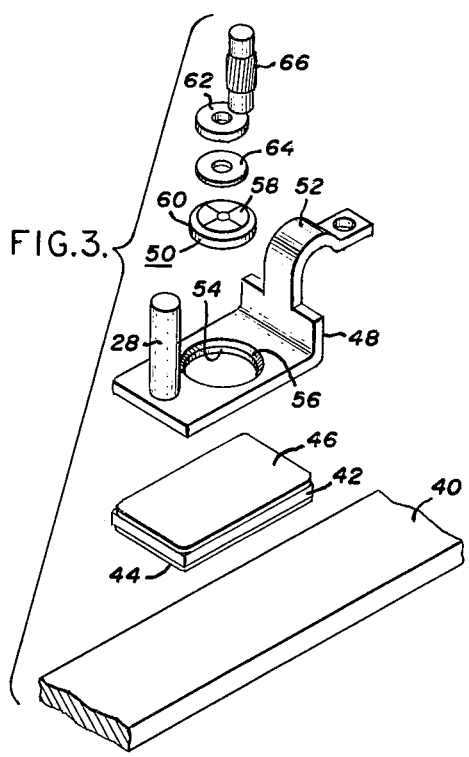
FIG. 6.
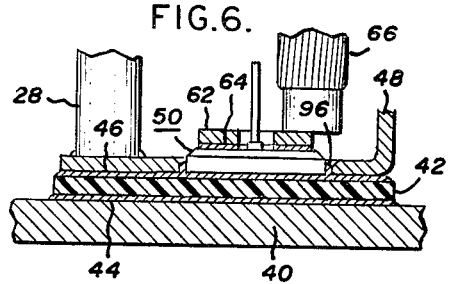
FIG. 4.
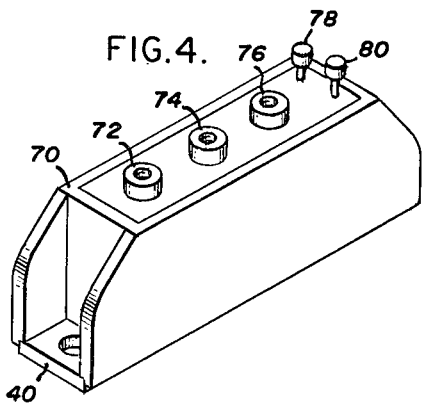
FIG. 5.
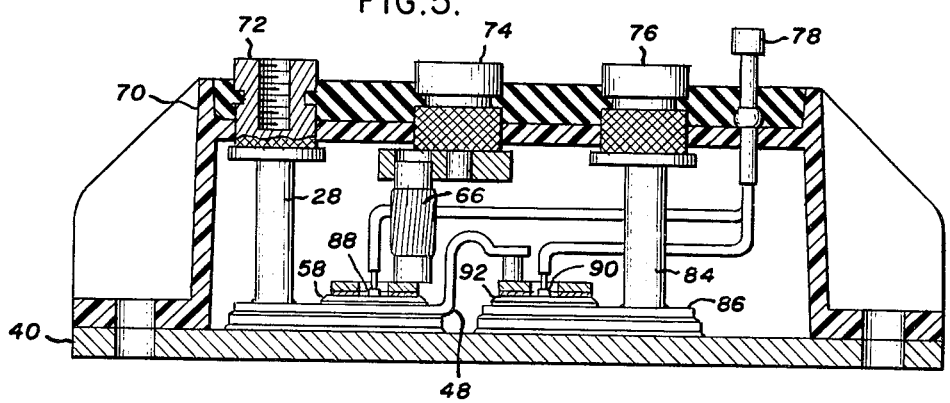

LOW THERMAL RESISTANCE, LOW STRESS SEMICONDUCTOR PACKAGE

This invention relates in general to semiconductor packages and more particularly to isolated semiconductor packages wherein especially low thermal impedance and long life, under conditions of repeated temperature cycling, are required.

An important function of a semiconductor device package is to provide effective thermal conduction between the semiconductor element for which the package is provided and an external heatsink to which the device is attached during operation. While a number of considerations determine the efficiency of heat transfer between the semiconductor element and the ultimate heatsink this invention is primarily concerned with those factors which are attributable to the structure of the semiconductor device itself, including the semiconductor element, the electrical insulating layer which isolates the semiconductor element from the device heatsink, and the device heatsink itself which is adapted to be connected to an external heatsink by conventional mechanical means. A typical semiconductor device in accordance with the prior art includes a number of different materials as well as a plurality of interfaces thermally and/or electrically coupling the materials for electrical connection to the semiconductor element and for thermal connection between the semiconductor element and the external heat-sink. The intimate assembly of these varied materials can lead to thermal stresses at the interfaces between the several elements as the device is subjected to heating and cooling during normal operation. It is common-place during the operation of such devices that the temperature thereof alternately increases and decreases as a result of the device being turned on and off. Differential expansion of package elements made of materials having different coefficients of thermal expansion inevitably stresses the interfaces therebetween and is a major cause of thermal fatigue in the package, and ultimately in the premature failure of the device. Where it is desired to package several semiconductor elements in a single hybrid module, the problem is aggravated inasmuch as additional parts which are required to be provided in the assembly in order to interconnect two or more devices, add thermal resistance in the path between the semiconductor element and the heatsink as well as potentially increasing the number of interfaces between materials having different coefficients of thermal expansion, which interfaces are the potential sites of failure due to thermal fatigue.

Because of its excellent electrical and thermal conductivity, copper is a desirable material for interconnecting multiple semiconductor elements within a single semiconductor module. In order to provide a surface which is readily soldered, copper parts are oftentimes nickel plates, or in the alternative, plated with a combination of nickel and silver. These plated copper elements may be soldered both to a metallized ceramic insulating member and to the electrode or stress relief plate of a semiconductor element or subassembly. Ceramic insulating members such as beryllium oxide and aluminum oxide are readilyy metallized as, for example, with molymanganese, or in the alternative, with copper according to the direct bond process described for example in U.S. Pat. No. 3,994,430 to Cusano, et al., of common assignee herewith, the contents of which are herein incorporated by reference. Typically, solder has been utilized as a joining medium. The melting point of lead-tin solder, which is widely used, depends upon the relative proportions of the two ingredients. For example, 37% lead–63% tin solder has a melting temperature of 181° C., while 50—50 lead-tin solder has a melting point of 216° C. Where materials with substantially different co-efficients of thermal expansion are joined with a solder layer, substantial stresses are produced in the solder layer due to both the bonding itself as well as when thermal cycling occurs. Lead-tin solders of the types described have a relatively low melting point and therefore exhibit relatively low residual stress (stress due to bonding dissimilar materials). They are, however, particularly subject to fatigue as the frequency of occurrence of thermal cycling stresses increases. For example, silicon devices are oftentimes bonded to a piece of refractory metal of low thermal coefficient of expansion close to that of silicon. Tungsten, molybdenum, and the like, are oftentimes employed. The thermal coefficient of expansion for molybdenum is $4.9 \times 10^{-6}$ in./in. °C. The thermal coefficient of expansion for copper is $17.0 \times 10^{-6}$ in./in. °C. The stresses developed at the refractory metal-copper interface are extremely high, and further, are dependent on the temperature at which the bond is formed, higher bonding temperatures resulting in higher residual stress. Accordingly, low temperature solders are preferred in order to maintain the stress level at the interface at an acceptable level. As has been mentioned, however, such low temperature soft solders have a limited fatigue life due in part to the absence of annealing of such layers, noncomplete plastic deformation, and the like.

A partial solution to the problem of limited fatigue life has been to employ hard solders such as gold-tin eutectic solders having melting points in the range of 280° C. Such hard solders are better able to withstand the stresses caused by differential thermal coefficient of expansion in dissimilar materials than the low temperature soft solders, but the high mechanical strength of the solder material introduces further problems which may be equally as detrimental as short thermal fatigue life. For example, when a high expansion coefficient material is directly bonded to the surface of a semiconductor element using hard solder, fracture at the soldered interface of the brittle semiconductor element is likely to occur. Such hard solder materials are also of very high cost.

As has been mentioned, thermal stresses developed at interfaces of two dissimilar materials are directly dependent on the bonding temperature. In small devices, i.e., in devices having a small physical size, the use of higher temperature bonding materials (such as solder of 280° C. melting) may represent an acceptable solution. In large devices, the stresses developed in the solder during bonding are oftentimes sufficient to physically deform one or the other of the bonded materials resulting in bowing or the like, as is commonly found. Such bowing leads to lack of flatness of parts of the semiconductor package especially the device heatsink which may result in thermal runaway problems inasmuch as the device may not be well coupled to an external heatsink. In an extreme case, the deformation of the package elements may be sufficient to crack to otherwise damage the semiconductor element resulting in device failure.

Accordingly, in high current, large area devices, compression packaging systems have been employed. The various elements of the device are placed in intimate but non-bonded contact and are urged together by internal or external spring forces. Such devices are widely employed in the high power semiconductor industry. Such compression devices suffer from several disadvantages, however. They are somewhat more complex and of substantially higher cost, requiring not only an external heatsink, but additionally, a clamp or the like, for providing the required compressive forces for proper operation. Such systems are of higher cost and greater complexity than devices where such additional structural elements are eliminated. Further, the efficiency of heat transfer from the device to an external heatsink where dry interfaces are employed is substantially less than a device wherein bonded or other wet interfaces are properly utilized.

Accordingly, it is an object of this invention to provide a semiconductor device having, in combination, lower thermal impedance between a semiconductor element and the device heatsink and lower thermal stresses during operation due to differential thermal expansion of the elements of the package.

It is another object of this invention to provide a multi-element semiconductor package wherein two or more semiconductor elements are connected by low electrical resistance members which are disposed so as not to increase the thermal impedance between the semiconductor elements and the device heatsink.

It is another object of this invention to provide such an improved semiconductor device wherein high temperature soft solders such as those consisting mainly of lead, or hard solders, may be employed so as to provide high reliability and long lifetime even in the presence of repeated temperature cycling.

It is still another object of this invention to provide such a semiconductor device at a low cost and an easy-to manufacture form.

Briefly stated and in accordance with one aspect of this invention, a semiconductor device is provided having heatsink adapted to be bonded to an external heatsink or heat exchanger. A layer of electrically insulating material is disposed on the device heatsink in low thermal impedance relation thereto. A relatively thin, current-spreading layer of highly annealed, electrically conductive material is bonded to the current-spreading layer. A relatively thicker, higher conductivity layer surrounds the electrical element and contacts the thin layer for providing low impedance electrical connection to the surface of the semiconductor element in contact with the thin, current-spreading layer. The layer provides electrical connection to the semiconductor element without introducing either the thermal impedance or the differential thermal coefficient of expansion of a thicker, completely nonannealed layer. Essentially, the thin layer functions solely as a current-spreading layer being substantially transparent from a thermal viewpoint.

The features of the invention which are believed to be novel are pointed out with particularity in the appended claims. The invention itself, however, both as to its organization and method of operation together with further objects and advantages thereof may best be understood by reference to the following description taken in connection with the accompanying drawings in which:

FIG. 1 is a cross-section view of a semiconductor device in accordance with the prior art;

FIG. 2 is a cross-section view of a semiconductor device in accordance with one aspect of this invention;

FIG. 3 is an exploded view of the elements of a semiconductor device in accordance with this invention;

FIG. 4 is an outline view of a multi-element semiconductor device in accordance with this invention;

FIG. 5 is a cross-section view of the device of FIG. 4;

FIG. 6 is a cross-section view of an alternative embodiment of this invention.

FIG. 1 is a section view of a prior art device including a semiconductor element 10 mounted to a thermal stress relief plate 12 which element and stress relief plate are bonded to electrode 14 by solder layer 16. Electrode 14 includes an interconnecting portion 18 which may conveniently provide electrical connection to another semiconductor element within the same package. Electrode 14 is further bonded to insulating layer 20 which is bonded to internal heatsink 22. The bonding of insulating layer 20 to heatsink 22 as well as the bonding of the electrode 18 to insulating layer 20 is accomplished by metallizing the insulating material as for example with an Mo-Mn system as is well known to those skilled in the art and then soldering the thus metallized insulating material to the heatsink and to the electrode. Conventionally, both the electrode and the heatsink are selected to have low thermal and electrical resistance and in many cases may be made of copper. Thus interfaces 24 and 26 between insulating layer 20 and electrode 18 and heatsink 22, respectively, are oftentimes multi-element interfaces and are illustrated herein as single layers solely for the purpose of simplifying the drawing. High current carrying capacity terminal 28 is also bonded to electrode 14 by brazing or the like and provides electrical connection to the lower terminal of the device. Connection to the upper contact of semiconductor device 10 is conveniently made by flexible lead 30, washer 32, and bonding layer 34. Washer 32 may conveniently be a molybdenum washer which is soldered to the top surface of semiconductor element 10. Likewise, lead 30 may be soldered to washer 32 at an interface which is not shown in detail herein.

Heat, generated within semiconductor element 10, must flow through stress relief plate 12, interface 16, electrode 14, interface 24, insulating member 20, interface 26, heatsink 22, and ultimately through the interface between heatsink 22 and an external heatsink prior to being dissipated into the air. The presence of a large number of heretofore essential elements and the interfaces between them increases the thermal impedance of a prior art device. Further, the presence of a plurality of dissimilar materials between semiconductor device 10 and the external heatsink, which materials have different coefficients of thermal expansion, results in the creation of substantial mechanical stresses, especially at the interfaces as the device heats and cools during normal operation.

A semiconductor device in accordance with one embodiment of the instant invention is illustrated at FIG. 2. It will be understood by those skilled in the art that while this invention is especially useful in and provides superior results for semiconductor devices, including two or more semiconductor elements in a single package, the application thereof is not so limited and single element semiconductor devices are equally within the ambit of the invention. Accordingly, FIG. 2 illustrates but a single semiconductor element in a form which is a portion of a two-element semiconductor device but which with only very slight modifications as will be hereinbelow described provides an exemplary, single element semiconductor device.

FIG. 3 is an exploded view of the structure of FIG. 2, wherein the individual elements may be more easily seen. Like reference numerals in FIGS. 2 and 3 denote like elements. A base member 40 is provided which base member is characterized by high thermal conductivity, and which, due to equalization of stresses on both sides of the electrically insulating layer may be thinner than has been heretofore possible without suffering from undesirable distortion due to stresses formed on bonding of the device. Typically, base 40 is made of copper which has excellent thermal conductivity and is relatively easy to fabricate in a desired shape. While copper is a presently preferred material for base member 40, this invention allows the use of other materials as, for example, steel or combinations of two or more materials, such as copper and steel, which materials are of lower cost. The strength and coefficient of thermal expansion of steel both allow and permit a relatively thinner base member to be utilized; for example, in accordance with this invention a steel base member having a thickness between one-third and one-sixth that of a copper base member is advantageously employed.

Due to the relatively small thickness which may be employed in accordance with this invention, base 40 may easily be stamped from a larger sheet of material and thus provided in an extremely low cost manner as compared to prior art methods wherein the thickness of material required eliminated punching or stamping as a method for forming the base. Base 40 acts as a heatsink for the device and also to transfer heat to an external heatsink to which it is mounted. Insulating layer 42 is provided with bonding layer 44 on a lower surface thereof which layer is selected to be compatible with and bondable to base 40 by soldering or the like. In accordance with a presently preferred embodiment of this invention, layer 44 is a direct bonded, copper layer; insulating layer 42 is a ceramic layer of, for example, alumina or beryllia, or a like material having a high thermal conductivity and which bonds directly to layer 44 as described for example in U.S. Pat. No. 3,994,430 to Cusano, et al., the contents of which are incorporated by reference herein. Alternatively, bonding layer 44 may be a metallized layer such as is formed by the moly-manganese metallization process well known to those skilled in the art. Or, as yet another alternative, any layer of material which forms a low thermal impedance bond to base 40 may be employed. The upper surface of insulating layer 42 is provided with current-spreading layer 46 which is a low electrical resistance layer which performs dual functions of conducting current from semiconductor subassembly 50 to electrode 48 as will be described and of providing thermal connection between semiconductor element 50 and insulating layer 42. Preferably, current-spreading layer 46 is also a direct bonded copper layer similar to and formed simultaneously with layer 44 in order to minimize the stress on insulating layer 42. In accordance with the preferred embodiment of this invention, layers 44 and 46 are each about 10 mils thick and exhibit the completely annealed characteristics of direct bond copper as described in the Cusano, et al. patent. In accordance with a preferred embodiment of this invention, insulating member 42 is bonded to current-spreading layer 46 and bonding layer 44; in accordance the direct bond process and copper layers 44 and 46 are nickel plated and solder coated prior to being bonded to base 40. It is preferred that base 40 also be nickel plated in order to enhance soldering thereto.

In order to increase the voltage handling capability of a device in accordance with this invention, current-spreading layer 46 and bonding layer 44 are made slightly smaller than insulating layer 42 in order to provide longer creep and strike paths between the two layers and between current spreading layer 46 and base 40. Further the corners of current spreading layer 46 are provided with a radius as indicated which further increases the creep and strike distances as well as eliminates thermal stress concentration points developed at the corners of direct bonded copper to ceramic interfaces. Electrode 48 is preferably a low electrical resistance electrode which will support a high current in accordance with the current capability of the device. It is not necessary, however, that electrode 48 have a particularly low thermal impedance inasmuch as it functions solely as a current-carrying electrode and is not in the thermal path between semiconductor subassembly 50 and heatsinkable base 40. Preferably, electrode 48 is fabricated of the same material and has similar thermal expansion characteristics as base 40 so that the stresses on the opposite sides of insulating member 42 are equalized. In accordance with an alternative embodiment of this invention, electrode 48 may be fabricated of a material which exhibits good electrical conductivity but which may have relatively poor thermal conductivity as compared with copper. Aluminum has been found to be an advantageously employed material for electrode 48 inasmuch as its electrical conductivity is relatively high and its cost is low compared to that of copper. Electrode 48 is provided with a connecting portion 52 which will be seen hereinbelow to provide electrical connection between multiple elements in a single device package in accordance with this invention. Electrode 48 is further provided with opening 54 into which semiconductor subassembly 50 is disposed in direct contact with current spreading layer 46. Preferably, opening 54 is provided with a beveled region 54 in order to increase the high voltage capability of the device by increasing the distance between semiconductor element 58 and electrode 48. Semiconductor subassembly 50 includes semiconductor element 58 and stress relief member 60 which are preferably bonded together prior to the assembly of this device. The use of such semiconductor subassemblies for higher current devices is well known to those skilled in the art, and tungsten and molybdenum are commonly employed as stress relief plates when silicon semiconductor elements are utilized inasmuch as there is good thermal coefficient of expansion compatibility therebetween. Preferably, contact is made to the upper surface of semiconductor element 58 by thermally compatible washer 62 which is preferably of molybdenum or tungsten and which may be suitably plated as for example with nickel-silver alloy and which is soldered to the upper surface of element 58. Where desired, a solder preform 64 may be used. Electrical lead 66 is bonded to upper stress relief washer 62 in a conventional manner by brazing at a relatively high temperature of about 700° C. prior to bonding washer 62 to semiconductor element 58.

The assembly of base 40; insulating member 42, to which current spreading layer 46 and bonding layer 44 have been previously applied, electrode 48, and the previously assembled subassembly which includes (semiconductor subassembly 50) and stress relief washer 62, lead 66 and (semiconductor subassembly 50) and the elements therebetween, is preferably accomplished in a single high temperature soldering step wherein a solder comprising about 95.2 percent lead, 0.05 percent tin, and 2.5 percent silver is used. This assembly operation may conveniently be carried out in a tunnel oven or the like. Solder interfaces are thereby provided between bonding layer 44 and base 40, between electrode 48 and current-spreading layer 46, between semiconductor subassembly 50 and current spreading layer 46, and between semiconductor subassembly 50 and washer 62.

A number of advantages of the instant invention may be readily observed by a comparison now between the structure of the prior art illustrated at FIG. 1 and the instant invention illustrated at FIG. 2. It will be seen that electrode 48 does not contribute to the thermal impedance between semiconductor subassembly 50 and base 40 while the electrode 18 in accordance with the prior art is thermally interposed between semiconductor subassembly 12 and base 22. The thermal impedance of a device in accordance with the prior art is increased not only by the presence of electrode 18 in the thermal path between the semiconductor device and the ultimate heatsink, but also by the presence of an additional interface 16 between the semiconductor element and the electrode. Neither the electrode nor the interface contribute to the thermal impedance of a device in accordance with the instant invention. Further, semiconductor subassembly 12 is bonded, in the prior art to electrode 18 which is, as is the case of the instant invention, a copper electrode having thermal characteristics which are very poor match to those of silicon and of molybdenum which are used for the semiconductor element and backup plate, respectively. Non-annealed copper is required for electrode 18 inasmuch as substantial mechanical strength is a requirement for processing handleability. The instant invention offers a substantial improvement inasmuch as non-annealed material is disposed between semiconductor subassembly 50 and relatively thin and highly annealed, current-spreading layer 46. Accordingly, the thermal stresses generated during temperature cycling of a device in accordance with the instant invention are significantly lower than has been heretofore possible, resulting in substantially improved reliability of the device, and equally important, allowing the use of high temperature soldering operations and higher temperature solders in assembly of the device, which greatly improves the thermal fatigue capabilities of the device.

FIG. 4 is an outline drawing of a two-element semiconductor device in accordance with this invention. A plastic or otherwise insulating housing 70 is bonded to base 40 and electrical terminals 72, 74, and 76 provide high current connection to the device while gate terminals 78 and 80 provide low current control connection.

The structure of a device according to FIG. 4 may be seen in the cross section view of FIG. 5 which also illustrates the interconnection of two semiconductor elements in a single package.

Like elements in FIGS. 2, 3, 4, and 5 are designated with like reference numerals. High current carrying capacity terminal posts 28 and 84 are connected to the electrodes 48 and 86. Screw-type terminals 72, 74, and 76 are connected to terminal posts 28 and 84 and to lead 66 by low temperature soldering for high mechanical strength. Gate leads 78 and 80 are likewise connected to gate electrodes 88 and 90 of semiconductor elements 58 and 92, respectively. A number of unique advantages and further details of the package illustrated at FIGS. 4 and 5 may be further appreciated by reference to copending U.S. Patent Application, Ser. No. 963,807, of common assignee herewith.

While the invention has been illustrated and described in accordance with a presently preferred embodiment thereof, various changes and modifications may occur to those skilled in the art which do not depart from the true spirit and scope of the invention. For example, although it is presently preferred to provide a relatively thick, direct bond copper current-spreading electrode in accordance with this invention, it is also appreciated that a relatively thinner current-spreading layer may be employed, fabricated for example according to the moly-manganese metallization process. Specifically, the thickness of metallization achievable directly according to the moly-manganese process is on the order of one or two mils, while direct copper bond electrodes may be provided having the thickness of ten mils or greater in a single step. Where the thinner current-spreading layers are used, it is preferred that electrical connection be made not only between electrode 48 and current-spreading layer 46, but also directly between electrode 48 and stress relief electrode 60 as shown in FIG. 6. This connection may readily be achieved by the introduction of solder ring 96 into peripheral space 94 which surrounds stress relief electrode 60. Where the spacing between electrode 48 and stress relief electrode 60 is sufficiently narrow, on the order of 5-10 mils or less, solder will be introduced into peripheral space 94 by capillary action during the assembly of the elements of this invention as hereinabove described.

In order to enhance this capillary action, it is preferred to nickel or nickel-silver plate thermal stress relief member 60 on the back and at least half way up the edges thereof. A comparison of the thermal impedance of a device fabricated in accordance with the prior art and a device fabricated in accordance with the instant invention as illustrated at FIG. 2 has demonstrated that the thermal impedance of a prior art device has thermal impedance measured between the junction and base 22 of between about 0.22° and 0.28° C. per watt while the thermal impedance of a device in accordance with this invention is about 0.15° C. per watt. Further, it is estimated that thermal fatigue life is at least an order of magnitude better than that of prior art devices, all these improvements being achieved in a device which has a lower cost than has been heretofore possible.

These and other modifications and changes are intended to be within the scope of the appended claims.

What is claimed is:

1. A semiconductor device having low thermal impedance and low electrical resistance comprising:
   a base member adapted to be mounted to an external heatsink in low thermal impedance connection therewith;
   an insulating member disposed on said base member and bonded thereto with a low thermal impedance bonding layer;
   a thin highly annealed current spreading layer disposed on said insulating layer in low thermal impedance relation therewith, said current spreading layer characterized by low electrical resistance;
   an electrically and thermally conductive stress relief means on said current spreading layer for matching the thermal coefficient of expansion of said semiconductor element and said current spreading layer;

a semiconductor element on said stress relief means in low stress bonding relationship therewith for minimizing the stress on said semiconductor element due to the difference in coefficient of thermal expansion between said current spreading layer and said semiconductor element; and an electrode on said current-spreading layer surrounding said stress relief means but laterally spaced apart therefrom to form a capillary chamber between the sidewalls of said stress relief means and the inside wall of said electrode, a solder layer in said capillary chamber thermally and electrically connecting said electrode to said stress relief member for providing electrical connection between said semiconductor element and said electrode without contributing to the thermal impedance between said semiconductor element and said base member.

2. The device of claim 1 wherein stress relief means comprises a layer of material having a coefficient of thermal expansion close to that of silicon.

3. The device of claim 1 wherein said current-spreading layer comprises a relatively thin, electrically conductive layer.

4. The device of claim 1 wherein said stress relief means comprises a layer of metal selected from the group consisting of tungsten and molybdenum.

5. The device of claim 2 wherein said coefficient of expansion is between the coefficient of expansion of silicon and the coefficient of expansion of said isolation layer.

6. The device of claim 2 wherein said stress relief means and said current-spreading layer are bonded together with a solder layer comprising a high temperature soft solder.

7. The device of claim 3 wherein said current-spreading layer is a moly-manganese layer.

8. The device of claim 1 wherein said electrode includes a beveled portion surrounding said semiconductor element for increasing the spacing between said element and said electrode so that the electrical breakdown voltage therebetween is increased.

9. The device of claim 1 wherein said current-spreading layer comprises a direct bond copper layer characterized by a highly annealed metallurgical state thereby minimizing the stress between said layer and said semiconductor element.

10. The device of claim 9 wherein said direct bond copper layer is between about 5 and about 15 mils thick.

11. The device of claim 1 wherein said electrode is an aluminum electrode.

12. The device of claim 6 wherein said solder is a lead-tin solder.

13. The device of claim 1 wherein said base member comprises a steel member.

* * * * *